(12) United States Patent
Crabill

(10) Patent No.: US 7,480,786 B1
(45) Date of Patent: Jan. 20, 2009

(54) METHODS AND CORES USING EXISTING PLD PROCESSORS TO EMULATE PROCESSORS HAVING DIFFERENT INSTRUCTION SETS AND BUS PROTOCOLS

(75) Inventor: Eric J. Crabill, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1334 days.

(21) Appl. No.: 10/417,775

(22) Filed: Apr. 16, 2003

(51) Int. Cl.
*G06F 15/00* (2006.01)

(52) U.S. Cl. .............. 712/34; 712/37; 712/32; 712/33

(58) Field of Classification Search .......... 712/34, 712/37, 32, 33
See application file for complete search history.

(56) References Cited

U.S. PATENT DOCUMENTS

| | | | | |
|---|---|---|---|---|
| 5,535,342 A | * | 7/1996 | Taylor | 710/315 |
| 5,574,927 A | | 11/1996 | Scantlin | |
| 5,657,241 A | * | 8/1997 | Butts et al. | 716/16 |
| 5,796,623 A | * | 8/1998 | Butts et al. | 703/23 |
| 6,052,773 A | * | 4/2000 | DeHon et al. | 712/43 |
| 6,230,119 B1 | * | 5/2001 | Mitchell | 703/27 |
| 6,480,952 B2 | * | 11/2002 | Gorishek et al. | 712/227 |

OTHER PUBLICATIONS

Xilinx, Inc.; "Virtex-II Pro Platform FPGA Handbook"; published Oct. 14, 2002; available from Xilinx, Inc., 2100 Logic Drive, San Jose, California 95124; pp. 19-71.

\* cited by examiner

*Primary Examiner*—Fritz Fleming
*Assistant Examiner*—Benjamin P Geib
(74) *Attorney, Agent, or Firm*—LeRoy D. Maunu; Lois D. Cartier

(57) ABSTRACT

Methods and cores using an existing processor implemented in a Programmable Logic Device (PLD) to emulate a target processor, where the existing and target processors support different instruction sets and conform to different bus interface protocols. A bus interface unit is coupled to an existing processor in a PLD. The bus interface unit is implemented using the programmable logic resources of the PLD, while the existing processor can be a dedicated processor or an existing "soft" processor. The bus interface unit acts as a peripheral device to translate bus transactions from the existing bus protocol (i.e., the bus protocol understood by the existing processor) to the target bus protocol. In addition, a stored emulation program emulates the target instruction set while executing instructions using the instruction set supported by the existing processor.

32 Claims, 2 Drawing Sheets

METHODS AND CORES USING EXISTING PLD PROCESSORS TO EMULATE PROCESSORS HAVING DIFFERENT INSTRUCTION SETS AND BUS PROTOCOLS

FIELD OF THE INVENTION

The invention relates to Programmable Logic Devices (PLDs) including processor cores. More particularly, the invention relates to methods and cores that use an existing PLD processor to emulate a target processor having a different instruction set and bus interface protocol.

BACKGROUND OF THE INVENTION

Programmable logic devices (PLDs) are a well-known type of digital integrated circuit that can be programmed to perform specified logic functions. PLDs can include, for example, re-programmable devices such as Complex Programmable Logic Devices (CPLDs) and Field Programmable Gate Arrays (FPGAs), and metal programmable devices such as Application Specific Integrated Circuits (ASICs). PLDs can also be implemented in other ways, e.g., using fuse or anti-fuse technology.

An FPGA typically includes an array of configurable logic blocks (CLBs) and programmable input/output blocks (IOBs). The CLBs and IOBs are interconnected by a programmable interconnect structure. Some FPGAs also include additional logic blocks with special purposes (e.g., DLLs, block RAM, multipliers, and so forth).

The interconnect structure, CLBs, IOBs, and other logic blocks are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

Some advanced FPGAs include processor blocks embedded in the CLB array. For example, each of the Xilinx Virtex-II Pro™ FPGAs includes several dedicated (fixed-function) processor blocks, each block implementing an IBM® PowerPC® RISC processor. ("IBM" and "PowerPC" are registered trademarks of International Business Machines Corporation.) The Xilinx Virtex-II Pro FPGA is described in detail in pages 19-71 of the "Virtex-II Pro Platform FPGA Handbook", published Oct. 14, 2002 and available from Xilinx, Inc., 2100 Logic Drive, San Jose, Calif. 95124, which pages are incorporated herein by reference.

The presence of dedicated processor blocks in an FPGA has many advantages for a system designer. For example, because of the great flexibility of the programmable resources, they are inherently significantly less area-efficient than dedicated logic. Therefore, a processor implemented in "soft logic" (i.e., using programmable multi-purpose logic blocks and routing) typically consumes a much larger area of the FPGA than a dedicated processor, which is implemented in "hard logic" (i.e., as a block of fixed-function logic).

Pre-designed functional blocks ("cores") are readily available for implementing processors in FPGAs. A "soft core" is a logic block implemented using multi-purpose programmable resources. An FPGA soft core can be, for example, a predetermined set of configuration bits that program the FPGA to perform one or more functions. A soft core can also be a netlist, source code, or schematics that describe the logic and connectivity of a design. Some soft cores include an optimally floorplanned layout targeted to a specific PLD (e.g., a specific family of FPGAs). Soft cores can also be parameterizable, i.e., allowing the user to enter parameters to activate or change certain core functionality. A "hard core" is a block of fixed logic in a PLD that can be incorporated into user designs, such as the dedicated processors in the Virtex-II Pro FPGAs referenced above.

A soft processor core can typically be modified to conform to desired specifications with regard to certain architectural features (e.g., bus widths) and protocols (e.g., bus timing). For example, Xilinx, Inc. offers a soft processor core called the MicroBlaze™ processor, which offers a selectable bit width.

A hard processor core is not as flexible as a soft processor core. A hard processor core possesses a fixed instruction set and operates according to a fixed bus interface protocol. For example, each Virtex-II Pro FPGA includes several IBM PowerPC processor cores. These processor cores support the IBM PowerPC instruction set and the associated bus interface protocol. Because the hard processor cores are implemented in dedicated logic, the instruction set and bus interface protocol of the hard cores cannot be altered.

However, it can be desirable to use a hard processor core to emulate a different processor with a different instruction set and a different bus interface protocol. Common situations in which this emulation is desirable include, for example, the desire to run software developed for a first processor in a system that includes a second and different processor. While a soft processor core could be developed or modified to correspond to the target processor, a hard processor core consumes much less area and can sometimes operate at a faster speed than a corresponding soft processor core. Therefore, it is desirable to provide methods and cores that use a hard processor core already available in a PLD to emulate a different processor with a different instruction set and a different bus interface protocol.

Further, not all PLDs include hard processor cores. However, design resources might not be available to develop a new soft processor core, or to modify an existing soft processor core using presently known methods, to match the instruction set and bus interface protocol of the target processor. Therefore, it is also desirable to provide methods and cores that can easily modify an existing soft processor core to emulate a different processor with a different instruction set and a different bus interface protocol.

SUMMARY OF THE INVENTION

The invention provides methods and cores using an existing processor implemented in a Programmable Logic Device (PLD) to emulate a target processor, where the existing and target processors support different instruction sets and conform to different bus interface protocols. A bus interface unit is coupled to an existing processor in a PLD. The bus interface unit is implemented using the programmable logic resources of the PLD, while the existing processor can be a dedicated processor or an existing "soft" processor. The bus interface unit acts as a peripheral device to translate bus transactions from the existing bus protocol (i.e., the bus protocol understood by the existing processor) to the target bus protocol. In addition, a stored emulation program emulates the target instruction set while executing instructions using the instruction set supported by the existing processor.

A first embodiment of the invention provides a method of using a dedicated processor embedded in a PLD to emulate a target processor. The dedicated processor supports a first instruction set and conforms to a first bus protocol, while the target processor supports a target instruction set and conforms to a target bus protocol. The target instruction set is different from the first instruction set, and the target bus protocol is different from the first bus protocol. First programmable resources of the PLD are configured to implement a first bus interface unit having first and second access ports. The first port is coupled to the dedicated processor and conforms to the first bus protocol, while the second port conforms to the target bus protocol. An emulation program is then executed in the dedicated processor. The emulation program emulates the target instruction set while executing instructions from the first instruction set, and interacts with the first bus interface unit via the first port.

In some embodiments, the dedicated processor has a programmable address space, which is configured to address the first bus interface unit. In some embodiments, the emulation program is stored in on-chip memory included in the dedicated processor. In other embodiments, the emulation program is stored in on-chip memory of the PLD external to the dedicated processor. In yet other embodiments, the emulation program is stored in off-chip memory external to the PLD. The interaction between the emulation program and the first bus interface unit can include at least one of the following: fetching instructions; loading operands; and storing operands. In some embodiments, the PLD is a Field Programmable Gate Array (FPGA).

Some embodiments of the invention can emulate a single target instruction set, but can use two potentially different bus interface units. Thus, the processor can interface with a wider variety and selection of peripherals. For example, in some embodiments the dedicated processor has a programmable address space, and the method also includes: configuring second programmable resources of the PLD to implement a second bus interface unit; configuring a first portion of the address space of the dedicated processor to address the first bus interface unit; and configuring a second portion of the address space of the dedicated processor to address the second bus interface unit. The first and second portions of the address space of the dedicated processor are non-overlapping. The second bus interface unit has a first port coupled to the dedicated processor and conforming to the first bus protocol, and a second port conforming to an additional bus protocol. The additional bus protocol is different from both the first bus protocol and the target bus protocol.

Another embodiment of the invention provides a method of using a soft processor embedded in a PLD to emulate a target processor. The soft processor supports a first instruction set and conforms to a first bus protocol, while the target processor supports a target instruction set and conforms to a target bus protocol. The target instruction set is different from the first instruction set, and the target bus protocol is different from the first bus protocol. First programmable resources of the PLD are configured to implement the soft processor. Second programmable resources of the PLD are configured to implement a first bus interface unit having first and second access ports. The first port is coupled to the dedicated processor and conforms to the first bus protocol, while the second port conforms to the target bus protocol. An emulation program is then executed in the soft processor. The emulation program emulates the target instruction set while executing instructions from the first instruction set, and interacts with the first bus interface unit via the first port.

According to another embodiment of the invention, a processor core for a PLD is provided that uses a dedicated processor to implement a target processor. The target processor supports a target instruction set and conforms to a target bus protocol. The processor core includes an instantiation of a dedicated processor embedded in the PLD, a first pre-defined functional block implementing a first bus interface unit, and an emulation program designated for storage in an address space of the dedicated processor. The dedicated processor supports a first instruction set and conforms to a first bus protocol, where the target instruction set is different from the first instruction set, and the target bus protocol is different from the first bus protocol. The first bus interface unit has a first port coupled to the dedicated processor and conforming to the first bus protocol, and a second port conforming to the target bus protocol. The emulation program emulates the target instruction set while executing instructions from the first instruction set, and interacts with the first bus interface unit via the first port.

According to another embodiment of the invention, a processor core for a PLD is provided that uses a soft processor to implement a target processor. The target processor supports a target instruction set and conforms to a target bus protocol. The processor core includes a first pre-defined functional block implementing a soft processor, a second pre-defined functional block implementing a first bus interface unit, and an emulation program designated for storage in an address space of the soft processor. The soft processor supports a first instruction set and conforms to a first bus protocol, where the target instruction set is different from the first instruction set, and the target bus protocol is different from the first bus protocol. The first bus interface unit has a first port coupled to the soft processor and conforming to the first bus protocol, and a second port conforming to the target bus protocol. The emulation program emulates the target instruction set while executing instructions from the first instruction set, and interacts with the first bus interface unit via the first port.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
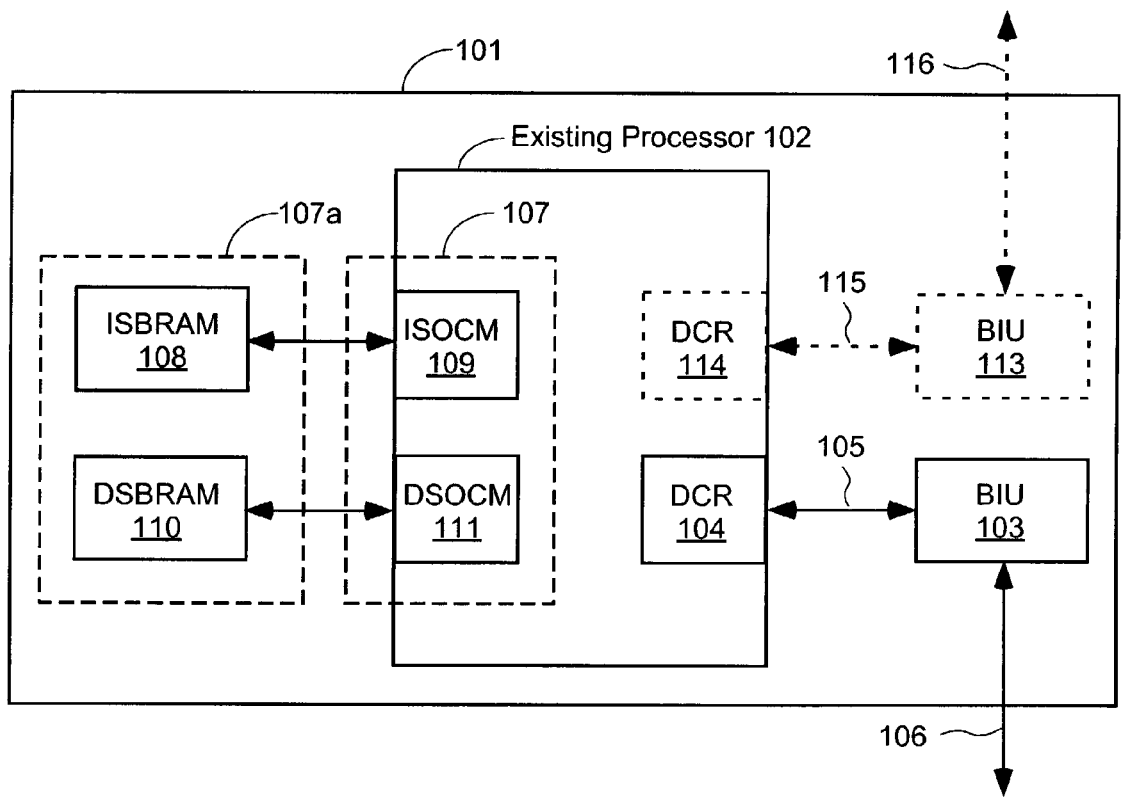
FIG. 1 shows a processor core implemented in a PLD according to an embodiment of the invention.

FIG. 1 illustrates a PLD implementation of a processor core. The processor core has a target instruction set and a target bus interface. However, the processor core makes use of an existing processor having a different instruction set and a different bus interface. The existing processor can be either a dedicated processor or a soft processor.

The processor core 101 of FIG. 1 includes an existing processor 102, at least one bus interface unit (BIU) 103, 113, and an emulation program 107. In the illustrated embodiment, the existing processor 102 includes a bus interface block (e.g., device control registers 104, 114) that uses a first bus protocol. Where existing processor 102 is a dedicated processor, clearly the existing bus protocol (used for buses 105, 115) is fixed. To emulate the target processor, the existing bus protocol is "translated" by BIUs 103, 113 to conform to the target bus protocol used by buses 106, 116. Thus, each BIU has two ports, a first port coupled to processor 102 through bus 105, 115 and using the existing bus protocol, and a second port coupled to the processor bus 106, 116 and using the target bus protocol.

In the pictured embodiment, BIUs 103, 113 interface with dedicated processor 102 via device control registers 104, 114. However, other methods of interfacing these two blocks can be used. For example, in the Virtex-II Pro FPGA, this interface can be accomplished via device control registers (as shown in FIG. 1), via a processor local bus (not shown), or as a memory-mapped peripheral in data side on-chip memory 111.

In some embodiments, only one BIU is included, and only one target processor is supported. In other embodiments, two or more BIUs are included, configured in some embodiments to conform to different target bus protocols.

In the illustrated embodiment, processor 102 also includes an instruction side on-chip memory 109 and a data side on-chip memory 111. The instructions for emulation program 107 are stored in instruction side on-chip memory 109. The data for emulation program 107 are stored in data side on-chip memory 111. On-chip memories 109, 111 are each optionally coupled to additional memory 107a external to the processor, e.g., instruction side block RAM 108 and data side block RAM 110.

Note that memories 108 and 110 might also be on-chip memories. Although they are not included in processor 102, memories 108 and 110 can be included in the PLD, e.g., as dedicated RAM blocks programmably coupled to processor 102. In some embodiments, additional memories 108, 110 are implemented using off-chip memory, i.e., memory not included in the PLD. In other embodiments, no memories external to the processor are used to store instructions or data for the emulation program.

In some embodiments, processor core 101 is implemented in a Virtex-II Pro FPGA from Xilinx, Inc. Therefore, the existing processor 102 is a dedicated IBM PowerPC processor. In one such embodiment, the target processor is a Zilog Z80 processor, and the target bus protocol is the Zilog Z80 processor bus protocol. In this embodiment, the IBM PowerPC processor 102 included in the FPGA executes a Zilog Z80 instruction set emulation program stored in the instruction side on-chip memory 109 of the processor and in a first on-chip block RAM 108. The emulation program requires a data set that can include, for example, temporary variables, jump tables, and Z80 processor state information. These data are stored in the data side on-chip memory 111 and in a second on-chip block RAM 110.

As the Z80 emulation program executes, the program fetches Z80 instructions over the Z80 processor bus 106 via BIU 103, from a storage device (not shown) coupled to the bus 106. BIU 103 is a Z80 processor bus interface unit implemented in programmable logic, and is controlled by the emulation program. The emulation program also loads and stores operands used with the Z80 instructions during execution. These load and store operations are also performed by the BIU 103 over Z80 processor bus 106. In the Virtex-II Pro FPGA, the BIU is accessed by the emulation program via the device control register (DCR) 104 on the IBM PowerPC processor, using instructions specific to the IBM PowerPC processor to perform reads and writes via the DCR. These steps result in the execution of bus cycles on the Z80 processor bus 106. External to the Z80 processor core, peripherals (not shown) and memory devices (not shown) compatible with the Z80 processor bus protocol interface with the processor core via bus 106.

Figure 2:
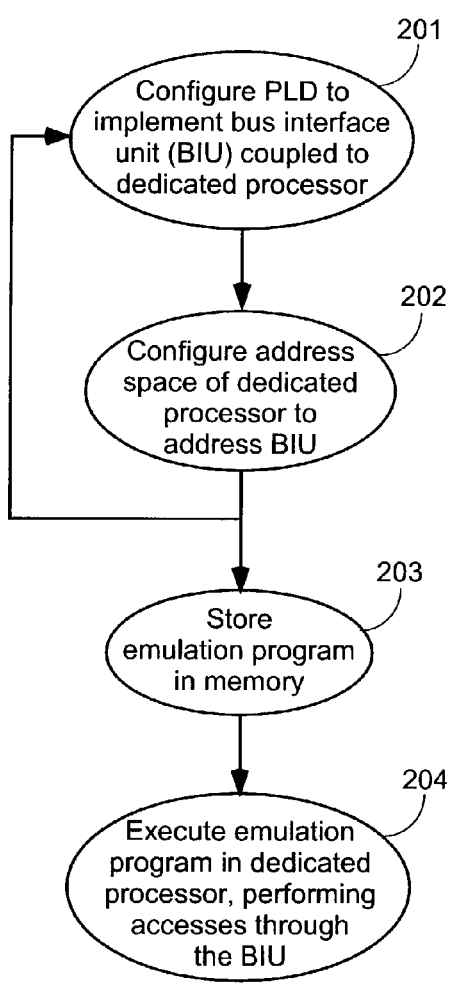
FIG. 2 illustrates a method of using a dedicated processor in a PLD to emulate a target processor having a different instruction set and bus protocol, according to an embodiment of the invention.

FIG. 2 illustrates the steps of a method of using a dedicated processor in a PLD to emulate a target processor having a different instruction set and bus protocol, according to an embodiment of the invention. The method of FIG. 2 can be used, for example, to emulate a Zilog Z80 processor using a Virtex-II Pro FPGA that includes an IBM PowerPC dedicated processor, as described above.

In step 201, programmable resources of the PLD are configured to implement a BIU coupled to the dedicated processor. For example, the BIU can be BIU 103 of FIG. 1. The BIU has a first port coupled to the dedicated processor and conforming to the bus protocol supported by the dedicated processor. The BIU has a second port conforming to the bus protocol supported by the target processor.

In optional step 202, the address space of the dedicated processor is configured to address the BIU. In some embodiments, this step is unnecessary, as the BIU uses a default address already present in the address space of the dedicated processor.

In some embodiments, steps 201-202 are repeated to implement another BIU also coupled to the dedicated processor. The second BIU can follow a different bus protocol than the first BIU, if desired. In some embodiments that include more than one BIU, the address space of the dedicated processor is configured to address the BIUs, using non-overlapping portions of the address space for each BIU. For example, in one embodiment half of the address space of the dedicated processor is configured to address a first BIU conforming to a Motorola 68000 bus protocol, while the other half of the address space is configured to address a second BIU conforming to a PCI bus protocol. The target instruction set can be that of yet a third processor, e.g., the Zilog Z80 processor.

In optional step 203, the emulation program is stored in memory. In some embodiments, this step is unnecessary, e.g., when the program is already stored and available in off-chip memory, or when the program is already programmed into on-chip memory, e.g., non-volatile memory. The memory in which the emulation program is stored can be, for example, memory included in the dedicated processor, on-chip memory external to the dedicated processor (e.g., dedicated block RAM in an FPGA), or off-chip memory.

In step 204, the emulation program is executed in the dedicated processor. Instructions in the target instruction set are fetched through the BIU, and data operands are also loaded and stored through the BIU. The stored emulation program controls the BIU to perform the required bus cycles on the target bus, while the BIU effectively translates a software access by the emulation program into a physical bus cycle executed using the target protocol. The stored emulation program also effectively translates instructions from the target instruction set into instructions that can be executed by the dedicated processor. Thus, seen from an external viewpoint, the dedicated processor appears to function in the same fashion as the target processor.

A significant advantage of the method of FIG. 2 is that it enables resource-efficient implementation of non-compatible processor architectures using an existing resource (the dedicated processor) in a PLD. This is a particular advantage when one or more dedicated processors would otherwise go unused in the PLD.

A similar method can be applied to soft processors. Development and verification of a soft processor can be a time-consuming task. Therefore, in some situations (e.g., when time-to-market is more critical than PLD area) it can be desirable to incorporate an existing soft processor into a new processor core, along with an appropriate BIU and emulation program, to provide support to computer programs targeted to a different processor.

Figure 3:
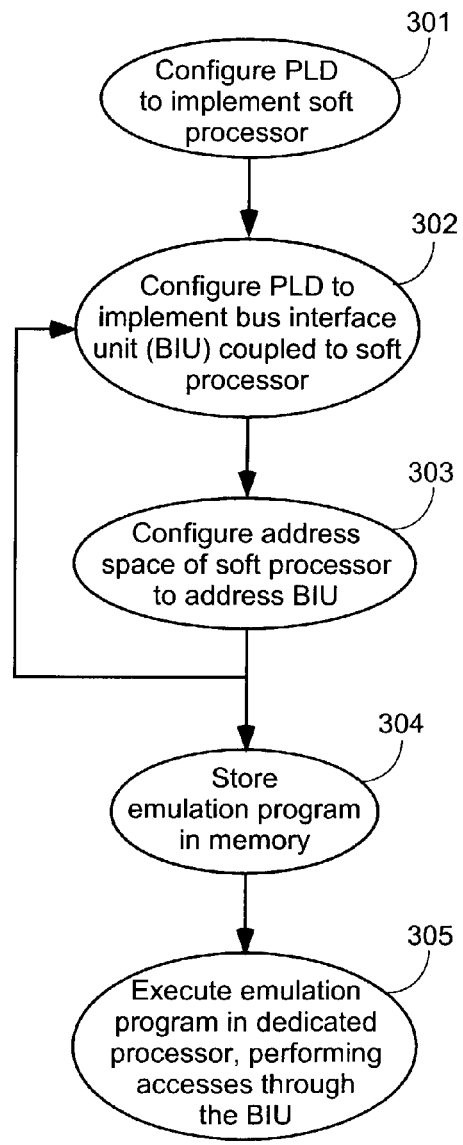
FIG. 3 illustrates a method of using an existing soft processor core in a PLD to emulate a target processor having a different instruction set and bus protocol, according to an embodiment of the invention.

FIG. 3 illustrates the steps of a method of using an existing soft processor in a PLD to emulate a target processor having a different instruction set and bus protocol, according to an embodiment of the invention. The method of FIG. 3 can be used, for example, to emulate a Zilog Z80 processor using a MicroBlaze soft processor in a Virtex-II™ FPGA from Xilinx, Inc., which does not include dedicated processors.

In step 301, programmable resources of the PLD are configured to implement an existing soft processor. For example, the soft processor can be a MicroBlaze soft processor from Xilinx, Inc.

In step 302, programmable resources of the PLD are configured to implement a BIU coupled to the soft processor. For example, the BIU can be BIU 103 of FIG. 1. The BTU has a first port coupled to the soft processor and conforming to the bus protocol supported by the soft processor. The BIU has a second port conforming to the bus protocol supported by the target processor (e.g., in the present example, the Zilog Z80 processor). Steps 301 and 302 can be executed in any order, or concurrently.

In optional step 303, the address space of the soft processor is configured to address the BIU. In some embodiments, this step is unnecessary, as the BIU uses a default or previously-stipulated address already present in the address space of the soft processor.

In some embodiments, steps 302-303 are repeated to implement another BIU also coupled to the soft processor. This second BIU can follow a different bus protocol than the first BIU, if desired. In some embodiments that include more than one BIU, the address space of the soft processor is configured to address the BIUs, using non-overlapping portions of the address space for each BIU.

In optional step 304, the emulation program is stored in memory. In some embodiments, this step is unnecessary, e.g., when the program is already stored and available in off-chip memory, or when the program is already programmed into on-chip memory, e.g., non-volatile memory. The memory in which the emulation program is stored can be, for example, memory included in the soft processor, on-chip memory external to the soft processor (e.g., dedicated block RAM in an FPGA), or off-chip memory.

In step 305, the emulation program is executed in the soft processor. Instructions in the target instruction set are fetched through the BIU, and data operands are also loaded and stored through the BIU. The stored emulation program controls the BIU to perform the required bus cycles on the target bus, while the BIU effectively translates a software access by the emulation program into a physical bus cycle executed using the target protocol. The stored emulation program also effectively translates instructions from the target instruction set into instructions that can be executed by the soft processor. Thus, seen from an external viewpoint, the soft processor appears to function in the same fashion as the target processor.

In some embodiments, the processor core (whether a dedicated processor or a soft processor) emulates different target processors with regard to the instruction set and the bus protocol. For example, a processor core can emulate the instruction set of a Zilog Z80 (for example) and conform to the bus protocol of a Motorola 6800 bus or a PCI bus. Note that the PCI bus is not a native processor bus, yet using the methods and cores of the invention allows an existing processor to interface with the PCI bus.

Those having skill in the relevant arts of the invention will now perceive various modifications and additions that can be made as a result of the disclosure herein. For example, the above text describes the methods and cores of the invention in the context of Field Programmable Gate Arrays (FPGAs). However, the methods and cores of the invention can also be implemented in other programmable logic devices (PLDs). As a further example, the target instruction sets and bus protocols referenced herein are purely exemplary. Many other instruction sets and bus protocols can be accommodated by the invention, including instruction sets and bus protocols yet to be developed. Accordingly, all such modifications and additions are deemed to be within the scope of the invention, which is to be limited only by the appended claims and their equivalents.

What is claimed is:

1. A method of using a dedicated processor embedded in a Programmable Logic Device (PLD) to emulate a target processor, the dedicated processor supporting a first instruction set and conforming to a first bus protocol, the target processor supporting a target instruction set and conforming to a target bus protocol, the method comprising:

configuring first programmable resources of the PLD to implement a first bus interface unit, the first bus interface unit having a first port coupled to the dedicated processor and conforming to the first bus protocol, and further having a second port conforming to the target bus protocol; and executing in the dedicated processor an emulation program that emulates the target instruction set while executing instructions from the first instruction set, the emulation program interacting with the first bus interface unit via the first port, wherein the target instruction set is different from the first instruction set, and wherein the target bus protocol is different from the first bus protocol.

2. The method of claim 1, wherein the dedicated processor has a programmable address space, the method further comprising configuring the address space of the dedicated processor to address the first bus interface unit.

3. The method of claim 1, further comprising:

storing the emulation program in on-chip memory included in the dedicated processor.

4. The method of claim 1, further comprising:

storing the emulation program in on-chip memory included in the PLD external to the dedicated processor.

5. The method of claim 1, further comprising:

storing the emulation program in off-chip memory external to the PLD.

6. The method of claim 1, wherein the emulation program interacting with the first bus interface unit comprises at least one of the following: fetching instructions; loading operands; and storing operands.

7. The method of claim 1, wherein the PLD is a Field Programmable Gate Array (FPGA).

8. The method of claim 1, wherein the dedicated processor has a programmable address space, the method further comprising:

configuring second programmable resources of the PLD to implement a second bus interface unit, the second bus interface unit having a first port coupled to the dedicated processor and conforming to the first bus protocol, and further having a second port conforming to an additional bus protocol different from both the first bus protocol and the target bus protocol;

configuring a first portion of the address space of the dedicated processor to address the first bus interface unit; and configuring a second portion of the address space of the dedicated processor to address the second bus interface unit, wherein the first and second portions of the address space of the dedicated processor are non-overlapping.

9. A method of using a soft processor in a Programmable Logic Device (PLD) to emulate a target processor, the soft processor supporting a first instruction set and conforming to a first bus protocol, the target processor supporting a target instruction set and conforming to a target bus protocol, the method comprising:

configuring first programmable resources of the PLD to implement the soft processor;

configuring second programmable resources of the PLD to implement a first bus interface unit, the first bus interface unit having a first port coupled to the soft processor and conforming to the first bus protocol, and further having a second port conforming to the target bus protocol; and executing in the soft processor an emulation program that emulates the target instruction set while executing instructions from the first instruction set, the emulation program interacting with the first bus interface unit via the first port, wherein the target instruction set is different from the first instruction set, and wherein the target bus protocol is different from the first bus protocol.

10. The method of claim 9, wherein the soft processor has a programmable address space, the method further comprising configuring the address space of the soft processor to address the first bus interface unit.

11. The method of claim 9, further comprising:

storing the emulation program in on-chip memory included in the soft processor.

12. The method of claim 9, further comprising:

storing the emulation program in on-chip memory included in the PLD external to the soft processor.

13. The method of claim 9, further comprising:

storing the emulation program in off-chip memory external to the PLD.

14. The method of claim 9, wherein the emulation program interacting with the first bus interface unit comprises at least one of the following: fetching instructions; loading operands; and storing operands.

15. The method of claim 9, wherein the PLD is a Field Programmable Gate Array (FPGA).

16. The method of claim 9, wherein the soft processor has a programmable address space, the method further comprising:

configuring third programmable resources of the PLD to implement a second bus interface unit, the second bus interface unit having a first port coupled to the soft processor and conforming to the first bus protocol, and further having a second port conforming to an additional bus protocol different from both the first bus protocol and the target bus protocol;

configuring a first portion of the address space of the soft processor to address the first bus interface unit; and configuring a second portion of the address space of the soft processor to address the second bus interface unit, wherein the first and second portions of the address space of the soft processor are non-overlapping.

17. A processor core for a Programmable Logic Device (PLD), the processor core implementing a target processor supporting a target instruction set and conforming to a target bus protocol, the processor core comprising:

an instantiation of a dedicated processor embedded in the PLD, wherein the dedicated processor supports a first instruction set and conforms to a first bus protocol, the dedicated processor having an address space;

a first pre-defined functional block implementing a first bus interface unit, the first bus interface unit having a first port coupled to the dedicated processor and conforming to the first bus protocol, and further having a second port conforming to the target bus protocol; and an emulation program designated for storage in the address space of the dedicated processor, wherein the emulation program emulates the target instruction set while executing instructions from the first instruction set, the emulation program interacting with the first bus interface unit via the first port, wherein the target instruction set is different from the first instruction set, and wherein the target bus protocol is different from the first bus protocol.

18. The processor core of claim 17, wherein the PLD includes on-chip memory, and the emulation program is further designated for storage in the on-chip memory of the PLD.

19. The processor core of claim 17, wherein the dedicated processor includes on-chip memory, and the emulation program is further designated for storage in the on-chip memory of the dedicated processor.

20. The processor core of claim 17, wherein the emulation program is further designated for storage in off-chip memory external to the PLD.

21. The processor core of claim 17, wherein the emulation program interacting with the first bus interface unit comprises at least one of the following: fetching instructions; loading operands; and storing operands.

22. The processor core of claim 17, wherein the PLD is a Field Programmable Gate Array (FPGA).

23. The processor core of claim 17, wherein the processor core comprises at least one of the following: a predetermined set of configuration bits for the PLD; a netlist; source code; and schematics.

24. The processor core of claim 17, further comprising:

a second pre-defined functional block implementing a second bus interface unit, the second bus interface unit having a first port coupled to the dedicated processor and conforming to the first bus protocol, and further having a second port conforming to an additional bus protocol different from both the first bus protocol and the target bus protocol.

25. A processor core for a Programmable Logic Device (PLD), the processor core implementing a target processor supporting a target instruction set and conforming to a target bus protocol, the processor core comprising:

a first pre-defined functional block implementing a soft processor, wherein the soft processor supports a first instruction set and conforms to a first bus protocol, the soft processor having an address space;

a second pre-defined functional block implementing a first bus interface unit, the first bus interface unit having a first port coupled to the soft processor and conforming to the first bus protocol, and further having a second port conforming to the target bus protocol; and an emulation program designated for storage in the address space of the soft processor, wherein the emulation program emulates the target instruction set while executing instructions from the first instruction set, the emulation program interacting with the first bus interface unit via the first port, wherein the target instruction set is different from the first instruction set, and wherein the target bus protocol is different from the first bus protocol.

26. The processor core of claim 25, wherein the soft processor includes on-chip memory, and the emulation program is further designated for storage in the on-chip memory of the soft processor.

27. The processor core of claim 25, wherein the PLD includes on-chip memory, and the emulation program is further designated for storage in the on-chip memory of the PLD external to the soft processor.

28. The processor core of claim 25, wherein the emulation program is further designated for storage in off-chip memory external to the PLD.

29. The processor core of claim 25, wherein the emulation program interacting with the first bus interface unit comprises at least one of the following: fetching instructions; loading operands; and storing operands.

30. The processor core of claim 25, wherein the PLD is a Field Programmable Gate Array (FPGA).

31. The processor core of claim 25, wherein the processor core comprises at least one of the following: a predetermined set of configuration bits for the PLD; a netlist; source code; and schematics.

32. The processor core of claim 25, further comprising:
a third pre-defined functional block implementing a second bus interface unit, the second bus interface unit having a first port coupled to the soft processor and conforming to the first bus protocol, and further having a second port conforming to an additional bus protocol different from both the first bus protocol and the target bus protocol.

* * * * *